United States Patent [19]

Watanabe et al.

[11] Patent Number: 5,346,801
[45] Date of Patent: Sep. 13, 1994

[54] METHOD OF FORMING IMAGES

[75] Inventors: Hiroshi Watanabe; Tatsuichi Maehashi; Koichi Nakatani; Katsunori Kato; Tawara Komamura, all of Hino, Japan

[73] Assignee: Konica Corporation, Tokyo, Japan

[21] Appl. No.: 33,497

[22] Filed: Mar. 18, 1993

[30] Foreign Application Priority Data

Apr. 1, 1992 [JP] Japan .................. 4-079928

[51] Int. Cl.$^5$ .................. G03F 7/34; G03F 7/031
[52] U.S. Cl. .................. 430/253; 430/200; 430/254; 430/257; 430/258; 430/260; 430/281; 430/288; 430/293; 430/914; 430/915; 430/920; 430/922; 430/926; 430/945
[58] Field of Search ............... 430/253, 281, 258, 257, 430/293, 288, 926, 200, 201, 254, 914, 915, 920, 922, 926, 945, 260

[56] References Cited

U.S. PATENT DOCUMENTS

| | | | |
|---|---|---|---|
| 3,060,023 | 10/1962 | Burg et al. | 430/254 |
| 3,060,024 | 10/1962 | Burg et al. | 430/254 |
| 3,060,025 | 10/1962 | Burg et al. | 430/291 |
| 3,640,219 | 2/1972 | Farnham et al. | 430/254 |
| 4,504,571 | 3/1985 | Yamamura et al. | 430/253 |
| 4,789,622 | 12/1988 | Leyrer et al. | 430/944 |
| 4,865,942 | 9/1989 | Gottschalk et al. | 430/916 |
| 4,895,787 | 1/1990 | Platzer | 430/253 |
| 4,910,120 | 3/1990 | Platzer et al. | 430/253 |
| 4,937,161 | 6/1990 | Kita et al. | 430/920 |
| 4,950,581 | 8/1990 | Koike et al. | 430/916 |
| 4,987,051 | 1/1991 | Taylor, Jr. | 430/258 |
| 5,001,036 | 3/1991 | Choi | 430/253 |
| 5,028,511 | 7/1991 | Choi | 430/253 |
| 5,057,393 | 10/1991 | Shanklin et al. | 430/914 |
| 5,143,818 | 9/1992 | Weed et al. | 430/281 |
| 5,153,100 | 10/1992 | Weed et al. | 430/281 |
| 5,166,041 | 11/1992 | Murofushi et al. | 430/944 |
| 5,198,321 | 3/1993 | Hosoi et al. | 430/200 |
| 5,200,292 | 4/1993 | Shinozaki et al. | 430/926 |
| 5,227,277 | 7/1993 | Waterman | 430/253 |

*Primary Examiner*—Charles L. Bowers, Jr.
*Assistant Examiner*—S. John Chu
*Attorney, Agent, or Firm*—Frishauf, Holtz, Goodman & Woodward

[57] ABSTRACT

An image forming process of an image forming material comprising a support and provided thereon, a photosensitive layer and a covering layer in that order comprises imagewise exposing the material by laser beam scanning, and peeling the covering film from the exposed material to form an image on the support or on the covering film, wherein said photosensitive layer contains a colorant, an addition-polymerizable or cross-linkable compound and a salt of a cationic dye with a borate anion represented by the following Formula (1):

Formula (1)

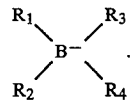

13 Claims, 1 Drawing Sheet

METHOD OF FORMING IMAGES

FIELD OF THE INVENTION

The present invention relates to a method of forming images. More specifically, the present invention relates to a method of forming images by use of an image forming material which can form images by exposing a photosensitive material followed by peel developing or image transfer, wherein the photosensitive material has a photosensitive composition layer provided on a support, capable of changing in adhesive strength by exposure and having a high photosensitivity to visible or near infrared light.

BACKGROUND OF THE INVENTION

Image forming materials using a photosensitive material such as a photopolymer and methods of forming images thereby are known, and some of them have so far been utilized in the preparation of a color proof for color correction in printing. For example, there is known a method of forming images by the steps of preparing an image forming material by coating on a support a photosensitive composition containing an addition-polymerizable or cross-linkable compound and a photopolymerization initiator, and if necessary, a colorant and a binder comprising an organic high polymer, exposing the photosensitive composition layer to harden its exposed portion, and dissolving an unexposed portion to remove it.

However, conventional methods which employ a liquid developer have problems concerning environmental protection and safety for workers, in addition to a disadvantage of requiring a large apparatus.

On the other hand, there have also been known methods of forming images according to the so-called dry process without liquid processing which processes a photosensitive material by peel developing or transfer developing.

In a method of forming images by use of such peel developing, as seen in, for example, Japanese Pat. Exam. Pub. No. 22901/1968, a material comprising a transparent support, a photopolymerizable composition layer and a second support is exposed and, then, the transparent support is peeled from the second support, so that a positive image is formed on one support and a negative image on the other support.

In a method which uses transfer developing, an image is formed by exposing an image through a color separation negative or mask on an image forming material comprising a support having thereon at least a photopolymerizable composition layer, and forming an image on an image receiving body by pressing and, if necessary, heating the exposed photopolymerizable composition layer with its surface in contact with the image receiving body and thereby transferring the unexposed portion to the image-receiving body, as described in U.S. Pat. Nos. 3,060,023, 3,060,024, 3,060,025, Japanese Pat. O.P.I. Pub. No. 147154/1988. These methods of forming images according to the dry processing are advantageous over the method using a liquid developer in environment pollution control, safety maintenance and apparatus downsizing.

With the progress of image processing technique, light source and image forming technique in recent years, there has come to be demanded a photosensitive material which is sensitive to light of longer wavelength. However, in the photosensitive compositions utilized in the foregoing methods of forming images, there have been used photopolymerization initiators, such as aromatic ketones including benzophenone, thioxanthone, quinone, thioacridone, and benzoin, benzil, benzylketal, which are sensitive in the ultraviolet wavelength region.

Various attempts have so far been made to make the photosensitive materials sensitive to a wavelength longer than that of visible light, as seen, for example, in Japanese Pat. O.P.I. Pub. Nos. 2528/1972, 155292/1979, 84183/1973, 151024/1979, 88005/1985, 40302/1983, 56403/1984, 189340/1984, 69/1990 and 189548/1990.

These photosensitive compositions are sensitive to visible light, but their sensitivity is not necessarily high enough to use practically. This necessitates a long exposing time and thereby impairs the efficiency of image formation by laser beam scanning exposure. In addition, these are not sensitive to a near infrared wavelength region corresponding to an oscillation wavelength of semiconductor lasers; therefore, semiconductor lasers which are the smallest and cheapest laser beam sources cannot be used.

Japanese Pat. O.P.I. Pub. No. 143044/1987 discloses a composition containing a novel photopolymerization initiator of cationic dye borate complex salt type, and a method of forming images by use of the initiator as well. However, the above patent specification does not disclose any initiator having a photosensitivity in the wavelength region of 780 nm or more which a semiconductor laser has; moreover, the method of forming images disclosed therein has a disadvantage of requiring complicated components such as micro-capsules.

Further, Japanese Pat. O.P.I. Pub. No. 4804/1990 discloses a photosensitive material, which is a combination of a cationic dye and a borate compound, and has a photosensitivity in the wavelength region of 600 to 900 nm to function as a photopolymerization initiator sensitive to a semiconductor laser. So far, however, there has not been known any method of forming color images by means of a simple dry process using a semiconductor laser and a photopolymerizable composition.

SUMMARY OF THE INVENTION

The present invention is accomplished in consideration of the foregoing problems.

An object of the invention is to provide a novel method of forming images which uses a laser with a wavelength longer than that of visible light, especially a semiconductor laser having a wavelength in the near infrared region, and is capable of forming high-quality images with a simple and small apparatus which uses no liquid developer.

The present inventors have continued a study to achieve the above object and found that use of an image forming material, which has a photosensitive composition containing a borate complex of a specific cationic dye as a photopolymerization initiator, gives a very high photosensitivity to visible or near infrared light and forms images of high quality. Accordingly, the object of the invention is achieved by the following constituents:

(1) A method of forming an image using an image forming material comprising a support bearing thereon at least a photosensitive composition layer and a covering film laminated in this order, wherein the photosensitive composition contains at least an addition-polymerizable or cross-linkable compound and a cationic dye borate complex, and an image is formed on the support or on the covering film by the steps of subjecting the image forming material to imagewise exposure by laser beam scanning, and peeling the covering film, utilizing the difference between the adhesion strength of exposed portions to the support or the covering film and that of unexposed portions to the support or the covering film.

(2) A method of forming an image using an image forming material comprising a support bearing thereon at least a photosensitive composition layer and a covering film laminated in this order, wherein the photosensitive composition contains at least an addition-polymerizable or cross-linkable compound and a cationic dye borate complex, and an image is formed by the steps of subjecting the image forming material to imagewise exposure by laser beam scanning, peeling the covering film, to form an image on the support or on the covering film, utilizing the difference between the adhesion strength of exposed portions to the support or the covering film and that of unexposed portions to the support or the covering film, and transferring the image formed on the support or the covering film to an image receiving material.

(3) A method of forming an image using an image forming material comprising a support bearing thereon at least a photosensitive composition layer, wherein the photosensitive composition contains at least an addition-polymerizable or cross-linkable compound and a cationic dye borate complex, and an image is formed by the steps of subjecting the image forming material to imagewise exposure by laser beam scanning to make a difference between the transferability of exposed portion and that of unexposed portion to an image receiving material, making the photosensitive composition layer of the image forming material contact with the image receiving material, and transferring exposed portions or unexposed portions of the photosensitive composition layer to the image receiving material.

(4) A method of forming an image as stated in paragraph (2), wherein a color image is formed by sequentially transferring images of photosensitive compositions respectively containing colorants of yellow, magenta and cyan, or yellow, magenta, cyan and black, on the same image receiving material.

(5) A method of forming images as stated in paragraph (3), wherein a color image is formed by sequentially transferring images respectively colored in yellow, magenta and cyan, or yellow, magenta, cyan and black, on the same image receiving body.

(6) A method of forming images as stated in paragraph (4) or (5), wherein a color image is formed by use of an image forming material having photosensitive composition layers provided by coating plural photosensitive compositions respectively containing colorants of yellow, magenta and cyan, or yellow, magenta, cyan and black, on the different areas of the same support.

(7) A method of forming images as stated in any of paragraphs (1) to (6), wherein exposing is performed imagewise by scanning near infrared laser beams having an oscillation wavelength of 700 nm or more.

DETAILED DESCRIPTION OF THE INVENTION

Figure 1:
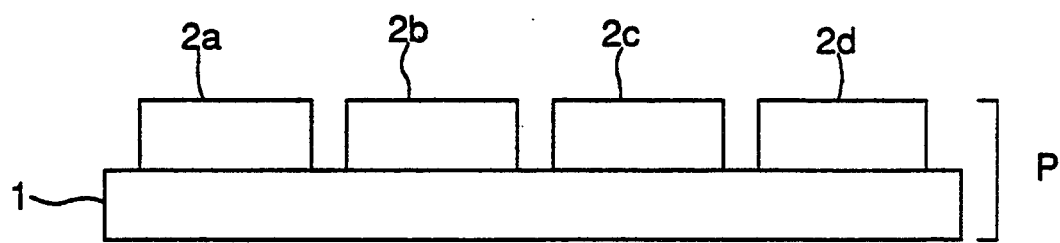
FIG. 1 is a cross section diagram of the full color image forming material P used in Example 12 viewed from the longitudinal direction.

Next, the invention is described in detail.

In the image forming material used in the method of forming images according to the invention, a photosensitive composition layer containing at least an addition-polymerizable or cross-linkable compound and a cationic dye borate complex on a support is provided.

Supports usable in the invention are plastic films such as a polyethylene film, a polypropylene film, a polyethylene terephthalate film, a polyethylene naphthalate film, a cellulose acetate film and a polyimide film.

Further, a release layer may be provided on a support. Such a release layer will do as long as it has a releasability to help transfer a layer formed thereon, especially a photosensitive composition layer peel-developed on an image as described later, to an image receiving sheet. Accordingly, the release layer is not particularly limited in compound type or thickness; but, examples of suitable compounds are those illustrated from the 11th line of the upper left column to the 13th line of the upper right column of page 3 of Japanese Pat. O.P.I. Pub. No. 154057/1991, and the thickness is 0.05 to 5 $\mu$m, preferably 0.1 to 2 $\mu$m.

The photosensitive layer contains an addition-polymerizable or cross-linkable compound as a first essential component. Such an addition-polymerizable or cross-linkable compound may be any of the conventional compounds, but a compound having at least one ethylenically unsaturated double bond is preferred. Examples thereof include monofunctional acrylates such as 2-ethylhexyl acrylate, 2-hydroxyethyl acrylate, 2-hydroxypropyl acrylate, glycerol acrylate, tetrahydrofurfuryl acrylate, phenoxyethyl acrylate, nonylphenoxyethyl acrylate, tetrahydrofurfuryloxyethyl acrylate, acrylate of 1,3-dioxane alcohol $\epsilon$-caprolactone adduct, 1,3-dioxolane acrylate, and methacrylates, itaconates, crotonates and maleates obtained by replacing the acrylic acid in the above acrylates with the respective acids; difunctional acrylates such as ethylene glycol diacrylate, triethylene glycol diacrylate, pentaerythritol diacrylate, hydroquinone diacrylate, resorcin diacrylate, hexandiol diacrylate, neopentyl glycol diacrylate, tripropylene glycol diacrylate, diacrylate of neopentyl glycol hydroxypivalate, diacrylate of neopentyl glycol adipate, diacrylate of neopentyl glycol hydroxypivalate $\epsilon$-caprolactone adduct, 2-(2-hydroxy-1,1-dimethylethyl)- 5-hydroxymethyl-5-ethyl-1,3-dioxane diacrylate, tricyclodecanedimethylol acrylate, $\epsilon$-caprolactone adduct of tricyclodecanedimethylol acrylate, diacrylate of 1,6-hexanediol diglycidyl ether, and dimethacrylates, diitaconates, dicrotonates and dimaleates obtained by replacing the acrylic acid in the above diacrylates with the respective acids; and polyfunctional acrylates such as trimethylolpropane triacrylate, ditrimethylolpropane tetracrylate, trimethylolethane triacrylate, pentaerythritol triacrylate, pentaerythritol tetracrylate, dipentaerythritol tetracrylate, dipentaerythritol pentacrylate, dipentaerythritol hexacrylate, $\epsilon$-caprolactone adduct of dipentaerythritol hexacrylate, pyrogallol triacrylate, dipentaerythritol propionate triacrylate, dipentaerythritol propionate tetracrylate, hydroxypivalaldehyde-modified dimethylolpropane triacrylate, and polymethacrylates, polyitaconates, polycrotonates and polymaleates obtained by replacing the acrylic acid in the above polyacrylates with the respective acids. Preferred among them are acrylates and methacrylates. These compounds may be used singly or in combination of two or more.

The photosensitive composition of the invention contains a cationic dye borate complex, a photopolymerization initiator as a second essential component. As a borate anion of a dye salt (hereinafter referred to as the dye of the invention) comprised of a cationic dye and a borate anion, a compound represented by the following formula (1) is preferred.

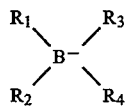

In the formula, $R_1$, $R_2$, $R_3$ and $R_4$, which may be the same or different, each represent an alkyl group (e.g., ethyl, butyl), an aryl group (e.g., phenyl, naphthyl), an aralkyl group (e.g., benzyl, phenethyl), an alkenyl group (e.g., vinyl, allyl), an alkynyl group (e.g., propinyl), a cycloalkyl group (e.g., cyclopentyl, cyclohexyl), a heterocyclic group (e.g., thienyl, pyridyl), each of which may have a substituent. In a preferred mode, at least one of $R_1$, $R_2$, $R_3$ and $R_4$ is an aryl group and at least one is an alkyl group.

As the aryl group, phenyl and naphthyl groups are preferred; these may be substituted with an alkyl or alkoxy group. As the alkyl group represented by $R_1$, $R_2$, $R_3$ or $R_4$, those having 1 to 12 carbon atoms are preferred; suitable examples are a methyl, ethyl, propyl, butyl, pentyl, hexyl, octyl and decyl group. These alkyl groups may be substituted with a halogen atom, an alkoxy, hydroxyl, cyano or phenyl group.

Suitable cationic dyes include cyanine, merocyanine, carbocyanine, rhodamine, azomethine, indoaniline, azulenium, polymethine, triarylmethane, indoline, thiazine, xanthene, acridine and oxazine dyes, which have an absorption in the visible or infrared region.

To draw an image through scanning exposure using a semiconductor laser light source, cationic red dyes are advantageously used. Cyanine-type, azulenium-type and indoaniline-type red dyes are particularly preferred. These dyes are described, for example, in "SHIKIZAI (Coloring Materials)", 61 [4], pp. 215–226. Typical examples are shown below:

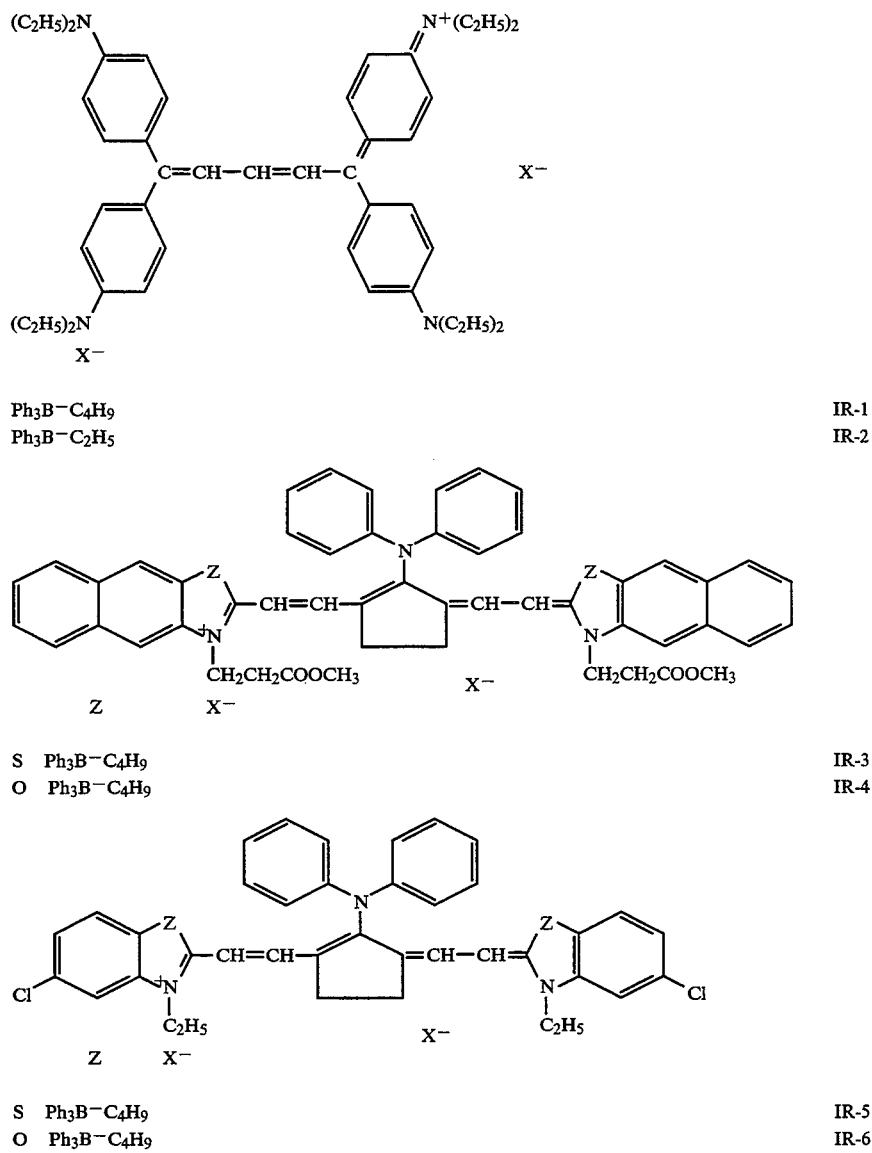

-continued
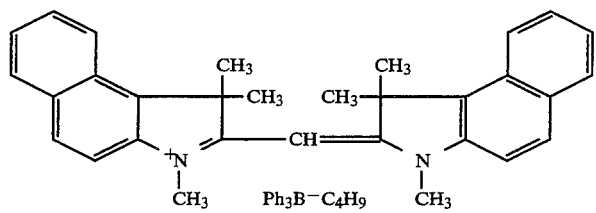
IR-7
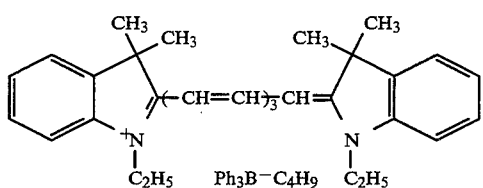
IR-8
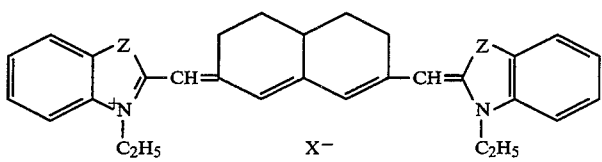
| Z | X⁻ | |
|---|---|---|
| S | (CH₃OPh)₃B⁻C₄H₉ | IR-9 |
| O | Ph₃B⁻C₄H₉ | IR-10 |
| S | (C₄H₉)₃B⁻Ph | IR-11 |
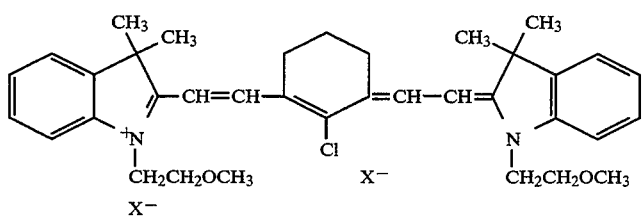
| | |
|---|---|
| Ph₃B⁻C₄H₉ | IR-12 |
| (CH₃OPh)₃B⁻C₄H₉ | IR-13 |
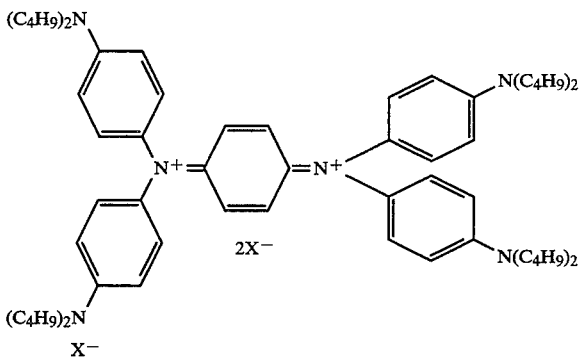
| | |
|---|---|
| Ph₃B⁻C₄H₉ | IR-14 |
| Ph₃B⁻C₆H₁₃ | Ir-15 |

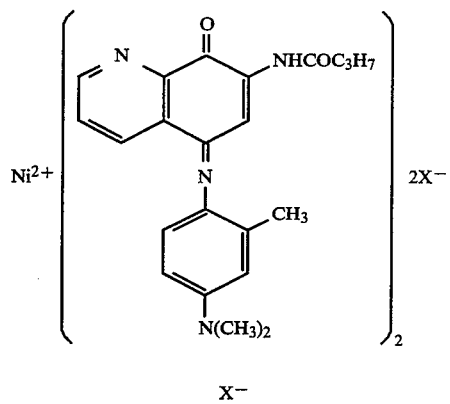

Ph$_3$B$^-$C$_4$H$_9$
Ph$_3$B$^-$C$_6$H$_{13}$

When exposing is performed with a visible light source, the following compounds are preferably used:

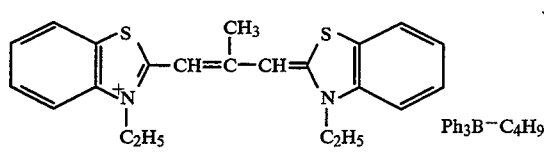 VI-1

Ph$_3$B$^-$C$_4$H$_9$

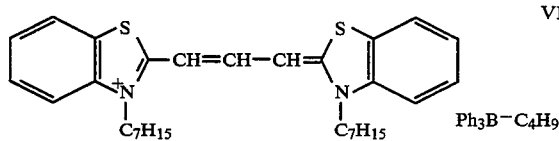 VI-2

Ph$_3$B$^-$C$_4$H$_9$

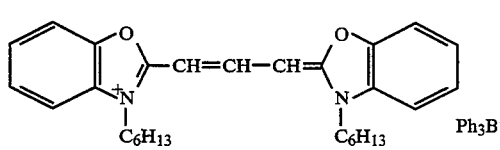 VI-3

Ph$_3$B$^-$C$_4$H$_9$

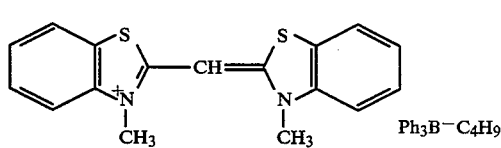 VI-4

Ph$_3$B$^-$C$_4$H$_9$

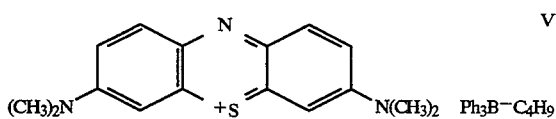 VI-5

Ph$_3$B$^-$C$_4$H$_9$

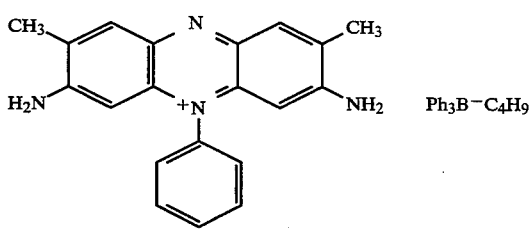 VI-6

Ph$_3$B$^-$C$_4$H$_9$

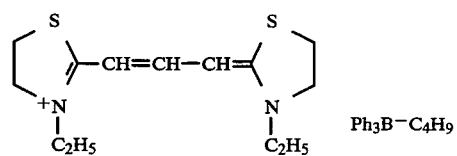 VI-7

Ph$_3$B$^-$C$_4$H$_9$

IR-16
IR-17

-continued

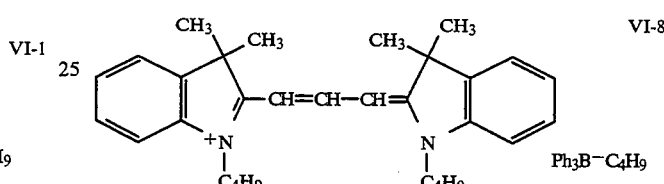 VI-8

Ph$_3$B$^-$C$_4$H$_9$

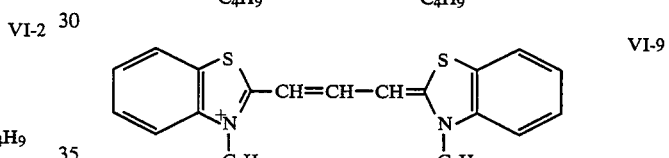 VI-9

(CH$_3$OPh)$_3$B$^-$C$_4$H$_9$

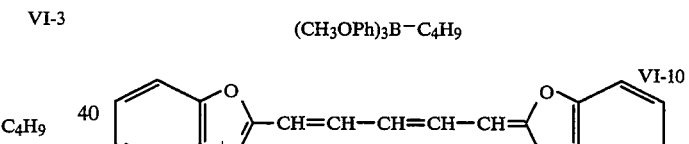 VI-10

(CH$_3$OPh)$_3$B$^-$C$_4$H$_9$

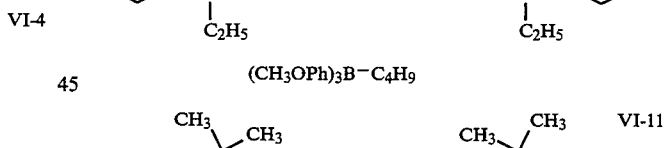 VI-11

Ph$_3$B$^-$C$_4$H$_9$

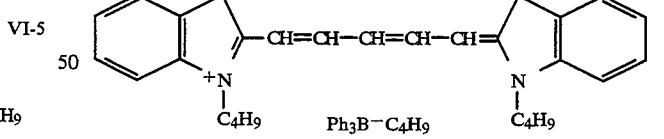 VI-12

(CH$_3$OPh)$_3$B$^-$C$_4$H$_9$

In a preferred embodiment of the invention, an ammonium salt of a borate anion (hereinafter referred to as the ammonium salt) is used as a sensitizer. Preferred ammonium salts are those comprising a quaternary ammonium cation and the borate anion expressed by the above formula (1).

Preferred quaternary ammonium cations are tetralkyl ammonium ions [(R)$_4$N$^+$]. The alkyl group is one having 1 to 12 carbon atoms (e.g., methyl, ethyl, propyl, butyl, pentyl, hexyl, octyl, decyl, dodecyl); these alkyl groups may have a substituent such as a halogen atom, an alkoxy, hydroxyl, cyano or phenyl group.

The amount of the foregoing essential components used in the photosensitive composition of the invention is not particularly limited, but the addition amount per 100 parts by weight of the addition-polymerizable or cross-linkable compound is preferably 0.01 to 20 parts by weight, especially 0.05 to 10 parts by weight for the cationic dye borate complex, and preferably 0 to 50 parts by weight, especially 0 to 20 parts by weight for the sensitizer.

Preferably, the photosensitive composition of the invention contains, besides the above components, a binder component for improving properties of the composition before and after curing. Preferred binder components are organic high-molecular weight compounds, which are appropriately selected according to requirements such as compatibility with other components, tackiness, adhesion properties, film-forming properties and development-improving properties.

Typical examples thereof include polymethacrylic acids; polymethyl methacrylates; polyacrylic acids; polyacrylic acid alkyl esters (alkyl groups are methyl, ethyl, butyl, etc.); copolymers between alkyl acrylates (alkyl groups are methyl, ethyl, butyl, etc.) and acrylonitrile, vinyl chloride, vinylidene chloride, styrene, butadiene, acrylic acid or methacrylic acid; polyvinyl chlorides; polyvinylidene chlorides; copolymers between vinyl chloride, vinylidene chloride, styrene or styrene-butadiene and acrylonitrile; polyacrylonitriles; polyvinyl alcohols; polyvinyl alkyl ethers (alkyl groups are methyl, ethyl, propyl, butyl, etc.); polyvinyl alkyl ketones; polystyrenes; polybutadienes; polyisoprenes; polyamides; polyurethanes; polyethylene terephthalates; polyethylene isophthalates; chlorinated polyolefines such as chlorinated polyethylenes and chlorinated polypropylenes; chlorinated rubbers; cyclized rubbers; ethylcelluloses; acetylcelluloses; polyvinyl butyrals; polyvinyl formals; iraconic acid copolymers; maleic acid copolymers and partially esterified maleic acid copolymers. These compounds may be used singly or in combination of two or more. Further, there may also be used multicomponent copolymers containing 30 mol % or more of the above compound as a major component.

These binder can be used in an amount of not more than 500 parts by weight, and preferably not more than 200 parts by weight, per 100 parts by weight of the above addition-polymerizable or cross-linkable compound.

The photosensitive composition of the invention may contain, when necessary, various additives such as heat polymerization inhibitors, colorants, plasticizers, resins, surface protection agents, leveling agents and coating aids.

Suitable heat polymerization inhibitors are quinone-type compounds and phenol-type compounds; examples thereof include hydroquinone, pyrogallol, p-methoxyphenol, catechol, β-naphthol and 2,6-di-t-butyl-p-cresol.

As colorants, there can be used pigments such as carbon black, titanium oxide, iron oxide, phthalocyanine pigments, azo pigments, anthraquinone pigments; and dyes and/or pigments such as Crystal Violet, Methylene Blue, azo dyes, anthraquinone dyes and cyanine dyes. When the present invention is used in making a color proof for printing color correction, it is preferable to use, as colorants, pigments and/or dyes respectively having color tones identical with the usual colors required in color correction, i.e., yellow, magenta, cyan and black. Using pigments in colors employed in printing inks is especially preferred to obtain color images having an appearance close to that of prints.

Many pigments and dyes are known in the art; the following are some examples (CI means color index).

Victoria Pure Blue (CI 42595), Auramine (CI 41000), Catiron Brilliant Flavin (CI basic 13), Rhodamine 6 GCP (CI 45160), Rhodamine B (CI 45170), Safranine OK70:100 (CI 50240), ERIOGRAUSHIN X (CI 42080), Fast Black HB (CI 26150), No. 1201 RIONORU Yellow (CI 21090), RIONORU Yellow GRO (CI 21090), SHIMURA Fast Yellow 8GF (CI21105), Benzidine Yellow 84Y-564D (CI 21095), SHIMURA Fast Red 4015 (CI 12355), RIONORU Red 7B4401 (CI 15830), FUASUTOGEN Blue TGR-L (CI 74160), RIONORU Blue SM (CI 26150) and Carbon Black.

The content of colorants in the photosensitive composition layer is determined according to the desired optical density, but it is usually 5 to 50%, preferably 10 to 35% by weight of the photosensitive composition layer.

Suitable plasticizers are phthalates such as dimethyl phthalate, diethyl phthalate, dibutyl phthalate, diheptyl phthalate, dioctyl phthalate, diisobutyl phthalate, dicyclohexyl phthalate, ditridecyl phthalate, diisononyl phthalate, dibutylbenzyl phthalate, diallyl phthalate; glycol esters such as dimethyl glycol phthalate, methylphthalyl ethyl glycolate, methylphthalyl ethyl glycolate; phosphates such as tricresyl phosphate, triphenyl phosphate, tributyl phosphate, tri-2-ethylhexyl phosphate; aliphatic monobasic acid esters such as butyl oleate, glycerin monooleate; aliphatic dibasic acid esters such as dibutyl adipate, diisobutyl adipate, dioctyl adipate, dioctyl azelate, dibutyl sebacate, dimethyl sebacate, dioctyl sebacate, dibutyl maleate; dihydric alcohol esters such as diethylene glycol dibenzoate, triethylene glycol di-2-ethylbutylate; and triethyl citrate, glycerin triacetate, butyl laurate, etc.

The photosensitive composition of the invention can be formed into the photosensitive composition layer by being coated on a support or a covering film without solvent, or by being dissolved in a solvent and then coated and dried on a support or a covering film.

The thickness of the photosensitive composition layer may be fixed according to the desired optical density, but resolution becomes better as the thickness becomes thinner within the allowable limit and, thereby, images of better quality are formed. Accordingly, the thickness is preferably 0.1 to 20 μm, especially 0.1 to 6 μm.

As solvents for a coating solution, there may be employed ketones such as acetone, methyl ethyl ketone, methyl isobutyl ketone, cyclohexanone, diisobutyt ketone; esters such as ethyl acetate, butyl acetate, amyl acetate, ethyl propionate, dimethyl phthalate, ethyl benzoate; aromatic hydrocarbons such as toluene, xylene, benzene, ethylbenzene; halogenated hydrocarbons such as carbon tetrachloride, trichloroethylene, chloroform, 1,1,1-trichloroethane, monochlorobenzene, chloronaphthalene, dichloroethane; ethers such as tetrahydrofuran, diethyl ether, ethylene glycol monomethyl ether, ethylene glycol monoethyl ether, ethylene glycol monoethyl ether acetate; dimethylformamide, and dimethyl sulfoxide.

The image forming material used in the invention preferably has a covering film provided on the photosensitive composition layer. Such a covering film requires a mechanical strength large enough to allow peeling, a high transmittance of visible and near infrared rays (a preferred light transmittance is 40% or more, especially 60% or more in the wavelength region of 300 to 2000 nm), and a high surface smoothness. In general, films of plastics such as polyethylene terephthalate, triacethylcellulose, diacethylcellulose, polyvinyl chloride, polyvinyl alcohol, a polycarbonate, polystyrene, polyethylene, polypropylene, cellophane, a polysulfone, a polyamide and a polyimide can be used singly or in a combination of two or more.

The thickness of the covering film is preferably 3 to 200 μm, especially 5 to 50 μm.

In providing a covering film for the image forming material used in the invention, such a covering film may be laminated, by heating and/or pressing, on the photosensitive composition layer formed on a support, or a covering film composition dissolved in a suitable solvent may be coated and dried on the photosensitive composition layer.

In addition to the foregoing layer configurations, the image forming material of the invention may have other layers, if necessary, within the limit not departing from the object of the invention. For example, an adhesion-controlling layer and/or a gas barrier layer can be optionally provided between the support and the photosensitive composition layer, and/or between the photosensitive composition layer and the covering film.

In forming images according to the method of the invention, imagewise exposure is performed by scanning the photosensitive composition layer with laser beams from one side of the image forming material. Use of a laser as light source enables scanning exposure to be carried out in response to image data by narrowing down the light to a beam. As a result, direct describing can be made using no masking material, moreover, this makes possible to form images with high resolution, because the optical system can be easily set so as to focus the laser beam on the photosensitive composition layer.

The laser used as light source in the invention includes well-known solid state lasers such as ruby lasers, YAG lasers, glass lasers, gas lasers such as He-Ne lasers, He-Xe lasers, argon lasers, krypton lasers, nitrogen lasers, carbon dioxide lasers, carbon monoxide lasers, as well as discharge excited molecule lasers, excimer lasers; chemical lasers, dye lasers, semiconductor lasers, etc. Preferred are argon lasers, He-Ne lasers and semiconductor lasers. Since semiconductor lasers vary in oscillation wavelengths depending upon their compositions, an appropriate composition can be selected according to the photosensitive wavelength region of an image forming material to be used. The compositions and oscillation wavelengths of preferred semiconductor lasers are as follows: InGaP laser (0.65 to 1.0 μm), AlGaAs laser (0.7 to 1.0 μm), GaAsP laser (0.7 to 1.0 μm), InGaAs laser (1.0 to 3.5 μm), InAsP laser (1.0 to 3.5 μm), $CdSnP_2$ laser (1.01 μm) and GaSb laser (1.53 μm).

In the method of forming images according to the invention, images are formed by peel developing or image transfer after imagewise exposure through scanning of laser beams.

In carrying out peel developing, an image forming material having a covering film on the photosensitive composition layer on a support is subjected to imagewise exposure, and the covering film is peeled off. Then, peel developing is performed so as to leave on the support either the exposed portion or the unexposed portion of the photosensitive composition layer, so that an image consisting of the photosensitive composition is formed. The image formed on the support or the covering film may be transferred to another image receiving material by superposing the image on the image receiving material and applying pressure and/or heat thereto.

In forming an image by image transfer, after carrying out imagewise exposure to make a difference between the transferability of exposed portions and unexposed portions of the photosensitive composition layer to the image receiving material, the photosensitive composition layer is brought into contact with an image receiving material and, then, pressure and/or heat is applied thereto, so that the exposed portion or the unexposed portion of the photosensitive composition layer is transferred to the image receiving material to form an image.

In case of necessity, post-treatments of the image so formed, such as irradiation of active rays or heating, may be carried out in order to accelerate polymerization or crosslinking.

When the photosensitive composition layer contains the foregoing colorant, a color image is formed by the foregoing procedure. When the photosensitive composition layer contains no colorant, a color image is formed by carrying out toning, a coloring procedure to bond a colored toner to the photosensitive layer. In the invention, a color image can be formed by bonding toners on the image portion of the photosensitive composition layer.

As toners for toning, colored powders are preferred. There can be used, as such colored powders, colored particles comprising pigments, dyes or mixtures thereof; further, there can also be used colored powders prepared by incorporating high polymer particles into such colored particles. These pigments or dyes may be used as colored powders as they are; but, preferably, these are surface-treated with polysiloxane, or dispersed or kneaded in resins, such as polyvinyl chlorides, cellulose acetates, cellulose acetate butylates, polystyrenes, polymethyl methacrylates, and then pulverized into colored particles having a proper effective particle size. The effective particle size of these colored particles is preferably 0.2 to 50 μm, and more preferably 0.5 to 30 μm.

Suitable high polymer particles are those obtained by pulverizing high polymers such as polyvinyl chlorides, cellulose acetates, polyethylenes, polymethyl methacrylates, polyethyl methacrylates, α-olefine-maleic anhydride copolymers to 2 to 60 μm. Such high polymer particles may be mixed with the foregoing colored particles at any ratio; but, preferably, these are mixed at a weight ratio of 1:3 to 3:1. Using colored particles jointly with high polymer particles enables colored particles to adhere uniformly to the image portion of the photosensitive composition layer after exposure and peel developing.

A combination of the imagewise exposure comprising laser beam scanning on an image forming material having the abovedescribed photosensitive composition layer and the dry processing comprising peel developing or image transfer enables a simple and precise image formation, without performing liquid processing which involves environmental problems, necessitates facilities to treat waste liquors, and requires a large equipment. Further, image formation using a semiconductor laser as light source and a photosensitive composition sensitive to the laser beam has advantages of not only decreasing the equipment size due to adoption of a small light source, but also reproducing clear colors in color image formation, because there can be used a cationic dye having little or no absorption in the visible light region as an initiator in the photosensitive composition layer.

In the invention, an image comprising plural color elements can be obtained on an image receiving sheet by forming plural monochromatic images different in colors and transferring these images in sequence on the same image receiving sheet. Particularly, a full color image can be formed on the image receiving sheet by transferring in sequence monochromatic images of yellow, magenta and cyan, or yellow, magenta, cyan and black.

In forming a full color image, though plural monochromatic images different in colors can be formed by use of plural image forming materials different in colors, it is preferable to use the so-called face sequence type image forming material which has photosensitive composition layers formed by coating plural photosensitive compositions respectively containing different colorants of yellow, magenta and cyan, or yellow, magenta, cyan and black, on different areas of the same support. Use of this image forming material simplifies the conveying system for image forming materials in an image forming apparatus and enables further downsizing of the image forming apparatus.

Further, there may also be used an image forming material for full color images which has detection marks for color identification.

The transfer of a color image to an image receiving material can be performed by making image portions of the support contact with an image receiving layer of the image receiving material and applying pressure thereto and, when necessary, applying heat thereto at the same time. Pressing can be performed in conventional manners including use of nip rolls.

EXAMPLES

The invention is described by the following examples in which parts are by weight unless otherwise stated. However, it will be apparent that the embodiment of invention is not limited to these examples within the spirit and scope of the invention.

EXAMPLE 1

The following adhesive layer composition (dry coating thickness. 1 μm) and photosensitive composition (dry coating thickness: 3 μm) were coated in order on a support of a 100-μm thick polyethylene terephthalate film by a wire bar coating method.

| Adhesive composition | |
|---|---|
| Butyl acetate | 75 parts |
| Polyvinyl acetate | 23 parts |
| Dioctyl phthalate | 2 parts |

| Photosensitive composition | |
|---|---|
| Diallyl isophthalate polymer (Daiso Isodap made by Daiso Co., Ltd.) | 90 parts |
| Dipentaerythritol hexacrylate (made by Nippon Kayaku Co., Ltd.) | 30 parts |
| Cationic dye borate complex (compound IR-1) | 1 part |
| Hydroquinone | 0.005 part |
| Toluene | 190 parts |
| Methyl ethyl ketone | 200 parts |
| Carbon black | 60 parts |

Subsequently, a 25-μm thick transparent polyethylene terephthalate film for a covering film was laminated by pressing on the photosensitive composition layer to obtain image forming material A.

EXAMPLE 2

Image forming material B was prepared in the same manner as in Example 1, except that the photosensitive composition was replaced by the following one.

| Photosensitive composition | |
|---|---|
| Diallyl isophthalate polymer (the foregoing Daiso Isodap) | 90 parts |
| Dipentaerythritol hexacrylate (made by Nippon Kayaku Co., Ltd.) | 30 parts |
| Cationic dye borate complex (compound IR-1) | 1 part |
| Hydroquinone | 0.005 part |
| Toluene | 190 parts |
| Methyl ethyl ketone | 200 parts |
| Carbon black | 60 parts |
| Chlorinated polyethylene (Super-Chlone 907LTA made by Sanyo-Kokusaku Pulp) | 5 parts |

EXAMPLE 3

Image forming material C was prepared in the same manner as in Example 1, except that the photosensitive composition was replaced by the following one.

| Photosensitive composition | |
|---|---|
| Diallyl isophthalate polymer (the foregoing Daiso Isodap) | 90 parts |
| Dipentaerythritol hexacrylate (made by Nippon Kayaku Co., Ltd.) | 30 parts |
| Cationic dye borate complex (compound IR-1) | 1 part |
| Organic boron ammonium salt (TBA.BTPB) (tetrabutyl ammonium salt of butyltriphenyl boron) | 3 parts |
| Hydroquinone | 0.005 part |
| Toluene | 190 parts |
| Methyl ethyl ketone | 200 parts |
| Carbon black | 60 parts |

EXAMPLE 4

Image forming material D was prepared in the same manner as in Example 1, except that the photosensitive composition was replaced by the following one.

| Photosensitive composition | |
|---|---|
| Diallyl isophthalate polymer (the foregoing Daiso Isodap) | 90 parts |
| Dipentaerythritol hexacrylate made by Nippon Kayaku Co., Ltd.) | 30 parts |
| Cationic dye borate complex (compound IR-1) | 1 part |
| Organic boron ammonium salt (TBA.BTPB) | 3 parts |
| Hydroquinone | 0.005 part |
| Toluene | 190 parts |
| Methyl ethyl ketone | 200 parts |
| Carbon black | 60 parts |
| Chlorinated polyethylene (Super-Chlone 907LTA | 25 parts |

-continued

| Photosensitive composition | |
|---|---|
| made by Sanyo-Kokusaku Pulp) | |

Image forming materials A to D prepared in Examples 1 to 4 were subjected to scanning exposure with a semiconductor laser under the following conditions and, then, the covering films were peeled off. The unexposed compositions were transferred to the covering films. Also shown are minimum energy necessary to obtain good images consisting of the cured compositions on the support. The energy is expressed by an average energy density in beam diameter of the laser irradiated on the photosensitive composition layers.

Exposure conditions

Light source: semiconductor laser (output: 100 mW, LTO90MD made by Sharp Corp.), Dominant wavelength: 830 nm, Optical system efficiency: 68%, Beam diameter: 15 μm, Scanning pitch: 10 μm

| Image Forming Material | Average Energy Density of Laser Beam |
|---|---|
| Sample A of Example 1 | 21 mJ/cm$^2$ |
| Sample B of Example 2 | 21 mJ/cm$^2$ |
| Sample C of Example 3 | 5 mJ/cm$^2$ |
| Sample D of Example 4 | 5 mJ/cm$^2$ |

EXAMPLE 5

Image forming material E was prepared by coating the following photosensitive composition (dry coating thickness: 2.5 μm) by the wire bar coating method on a 100-μm thick polyethylene terephthalate film.

| Photosensitive composition | |
|---|---|
| Diallyl isophthalate polymer (the foregoing Daiso Isodap) | 90 parts |
| Dipentaerythritol hexacrylate (made by Nippon Kayaku Co., Ltd.) | 30 parts |
| Cationic dye borate complex (compound IR-1) | 1 part |
| Organic boron ammonium salt (TBA.BTPB) | 3 parts |
| Hydroquinone | 0.005 part |
| Toluene | 190 parts |
| Methyl ethyl ketone | 200 parts |
| Carbon black | 60 parts |

The image forming material E was exposed imagewise as in Example 4 by scanning semiconductor laser beams (semiconductor laser: LTO90MD made by Sharp Corp., oscillation wavelength: 830 nm, output: 100 mW). The exposure energy at the surface of the image forming material (an average energy density of light irradiated on the surface of the photosensitive layer) was 5 mJ/m$^2$. After the imagewise exposure, the photosensitive composition layer of image forming material E was superposed on a sheet of art paper, an image receiving material, and laminated thereon at 150° C. After cooling the resulting sample to room temperature, the polyethylene terephthalate film was removed. Thus, an image consisting of the uncured photosensitive composition was formed in good conditions on the art paper.

EXAMPLE 6

Image forming material F was prepared by repeating the procedure of Example 1, except that the photosensitive composition was replaced by the following one.

| Photosensitive composition | |
|---|---|
| Diallyl isophthalate polymer (the foregoing Daiso Isodap) | 90 parts |
| Dipentaerythritol hexacrylate (made by Nippon Kayaku Co., Ltd.) | 30 parts |
| Cationic dye borate complex (compound VI-3) | 1 part |
| Organic boron ammonium salt (TBA.BTPB) (tetrabutyl ammonium salt of butyl trianisyl boron) | 3 parts |
| Hydroquinone | 0.005 part |
| Toluene | 190 parts |
| Methyl ethyl ketone | 200 parts |
| Carbon black | 60 parts |

EXAMPLE 7

Image forming material G was prepared by repeating the procedure of Example 1, except that the photosensitive composition was replaced by the following one.

| Photosensitive composition | |
|---|---|
| Diallyl isophthalate polymer (the foregoing Daiso Isodap) | 90 parts |
| Dipentaerythritol hexacrylate (made by Nippon Kayaku Co., Ltd.) | 30 parts |
| Cationic dye borate complex (compound VI-3) | 1 part |
| Organic boron ammonium salt (TBA.TABB) | 3 parts |
| Hydroquinone | 0.005 part |
| Toluene | 190 parts |
| Methyl ethyl ketone | 200 parts |
| Carbon black | 60 parts |
| Chlorinated polypropylene (Super-Chlone 306 made by Sanyo-Kokusaku Pulp) | 3 parts |

Image forming materials F and G were processed in the same manner as in Example 1, except that these were subjected to scanning exposure with an argon laser under the following conditions. Good quality images of cured resins were obtained.

Exposure conditions

Light source: argon laser (output: 75 mW, product of Autex Co., Ltd.), Dominant wavelength: 488 nm, Optical system efficiency: 60%, Average energy density of light irradiated on the photosensitive layer: 3 mJ/cm$^2$ Beam diameter: 15 μm, Scanning pitch: 10 μm

EXAMPLE 8

Image forming material H was prepared by the steps of coating the following photosensitive composition to a dry coating thickness of 3 μm on the same support as in Example 1, forming thereon the same adhesive layer as in Example 1, and repeating the same lamination procedure as in Example 1.

| Photosensitive composition | |
|---|---|
| Diallyl isophthalate polymer (the foregoing Daiso Isodap) | 90 parts |
| Dipentaerythritol hexacrylate (made by Nippon Kayaku Co., Ltd.) | 30 parts |
| Cationic dye borate complex (compound IR-1) | 1 part |
| Organic boron ammonium salt (TBA.HTPB) (tetrabutyl ammonium salt of hexyltripenyl boron) | 3 parts |
| Hydroquinone | 0.005 part |
| Toluene | 190 parts |
| Methyl ethyl ketone | 200 parts |

A scanning exposure with a semiconductor laser was performed under the following conditions on the covering film of image forming material H through a desired negative pattern, and the covering film was removed.

An image consisting of the uncured photosensitive composition was obtained on the support.

Subsequently, toning was performed by applying to this uncured image-carrying photosensitive composition layer a black powder toner, a 1:1 mixture of black cellulose acetate particles dispersing carbon black therein and cellulose acetate particles. Then, the excess of toner was removed by lightly rubbing the photosensitive composition layer with a cotton pad. Obtained was a good black image carrying the toner only on the surface of the image consisting of the photosensitive composition.

Exposure conditions

Light source: semiconductor laser (output: 100 mW, LTO90MD made by Sharp Corp.), Dominant wavelength: 830 nm, Optical system efficiency: 68% Beam diameter: 15 μm, Scanning pitch: 10 μm, Average energy density of light irradiated on the photosensitive layer: 5 mJ/cm$^2$.

EXAMPLE 9

A full color image was formed using four color (black, cyan, magenta and yellow) sheets of image forming materials prepared in the same way as in Example 8. Firstly, the four color sheets were image wise exposed corresponding to images in black, cyan, magenta and yellow, respectively, and followed by peel developing. Thus, the photosensitive layers having images corresponding to the respective colors were formed.

Subsequently, the photosensitive layer carrying the image corresponding to yellow images was subjected to toning in a similar manner as above, using a yellow powder toner comprising Benzidine Yellow 4T-564-D and cellulose acetate (1:1) to form the yellow image. This toning procedure was repeated to form the blue image, red image and black image on the respective photosensitive layer; the blue powder toner used in blue toning was a 1:1 mixture of Phthalocyanine Blue and cellulose acetate, and the red powder toner was a 1:1 mixture of Quinacridone Magenta and cellulose acetate. Then, the black image was superposed on a sheet of art paper, an image receiving material, and passed through a pair of nip rolls to transfer the image to the art paper. The transfer of color image was repeated in order of cyan, magenta and yellow images. Thus, a full color image comprising four colors was obtained on the art paper.

The full color image so obtained had no image defects showing a satisfactory image transfer, and the adhesion between the image and the art paper was also excellent. Moreover, the resulting image closely resembled the original print in appearance and quality, since only the image portion was transferred to form the image.

EXAMPLE 10

Image forming materials I, J and K were prepared in the same manner as in Example 3, except that the carbon black in the photosensitive composition was replaced with the following pigments:

| Image Forming Material | Pigment |
| --- | --- |
| I (cyan) | Cyanine Blue 4920 (Dainichiseika Co.) |
| J (magenta) | Seika Fast Carmine 1483 (Dainichiseika Co.) |
| K (yellow) | Seika Fast Yellow H-7055 (Dainichiseika Co.) |

Using these three color image forming materials I, J, K and the black image forming material C prepared in Example 3, a color image was formed. That is, laser beam exposures of images corresponding to black, cyan, magenta and yellow images were sequentially carried out in order of image forming material C, I, J and K, under the same conditions as in Example 8, and the covering films were removed to obtain images on the supports (polyethylene terephthalate film) in respective colors.

Then, the black image was brought into contact with a sheet of art paper, an image receiving material, and passed through a pair of nip rolls to transfer the black image to the art paper. The transfer of color image was repeated likewise in order of cyan, magenta and yellow to obtain on the art paper a full color image comprising four color.

The resulting full color image had no image defects as in Example 9 and was excellent in image transfer, adhesion to the art paper, and had an appearance and quality close to those of the original print.

EXAMPLE 11

Image forming materials L, M and N were prepared in the same manner as in Example 5, except that the carbon black in the photosensitive composition was replaced with the following pigments:

| Image Forming Material | Pigment |
| --- | --- |
| L (cyan) | Cyanine Blue 4920 (Dainichiseika Co.) |
| M (magenta) | Seika Fast Carmine 1483 (Dainichiseika Co.) |
| N (yellow) | Seika Fast Yellow H-7055 (Dainichiseika Co.) |

Using these three color image forming materials L, M, N and the black image forming material E prepared in Example 5, a color image was formed; i.e., laser beam exposures of images corresponding to black, cyan, magenta and yellow images were sequentially carried out in order of image forming materials E, L, M and N, under the same conditions as in Example 8. After these imagewise exposures, the photosensitive composition layer of image forming material E was superposed on a sheet of art paper, an image receiving body, and laminated thereon at 150° C. After allowing them to cool to room temperature, the polyethylene terephthalate film was removed, so that a black image comprising the uncured photosensitive composition was obtained on the art paper in good condition. Subsequently, image transfer was repeated in order of cyan, magenta and yellow. Obtained on the art paper was a full color image comprising four color elements.

The resulting full color image had no image defects and was excellent in image transfer and adhesion to the art paper. Moreover, since an image comprising only an image portion was obtained, the image was very close to the original print in appearance and quality.

EXAMPLE 12

Figure 2:
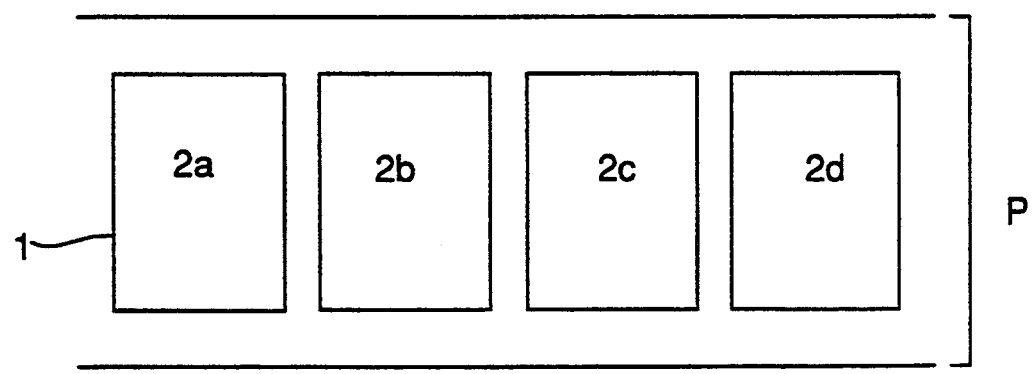
FIG. 2 is a top view of the above image forming material.

A face sequence type image forming material P, which had photosensitive component layer 2a containing a yellow colorant, photosensitive component layer 2b containing a magenta colorant, photosensitive component layer 2c containing a cyan colorant and photosensitive component layer 2d containing a black colorant on support 1 as shown in FIGS. 1 and 2, was prepared by coating, with a wire bar coater, the following four photosensitive composition solutions (yellow, magenta, cyan and black) on a 100 μm thick polyethylene terephthalate film support, leaving a space between coats and drying to 3 μm thickness.

| Photosensitive composition (yellow) | |
|---|---|
| Diallyl isophthalate polymer (the foregoing Daiso Isodap) | 90 parts |
| Dipentaerythritol hexacrylate (made by Nippon Kayaku Co., Ltd.) | 30 parts |
| Cationic dye borate complex (compound IR-1) | 1 part |
| Organic boron ammonium salt (TBA.BTPB) | 3 parts |
| Hydroquinone | 0.005 part |
| Toluene | 190 parts |
| Methyl ethyl ketone | 200 parts |
| Seika Fast Yellow 7055 (made by Dainichiseika Co., Ltd.) | 60 parts |
| Chlorinated polyethylene (the foregoing Super-Chlone 907LTA) | 25 parts |

| Photosensitive composition (magenta) | |
|---|---|
| Diallyl isophthalate polymer (the foregoing Daiso Isodap) | 90 parts |
| Dipentaerythritol hexacrylate (made by Nippon Kayaku Co., Ltd.) | 30 parts |
| Cationic dye borate complex (compound IR-1) | 1 part |
| Organic boron ammonium salt (TBA.BTPB) | 3 parts |
| Hydroquinone | 0.005 part |
| Toluene | 190 parts |
| Methyl ethyl ketone | 200 parts |
| Seika Fast Carmine 1483 (made by Dainichiseika Co., Ltd.) | 60 parts |
| Chlorinated polyethylene (the foregoing Super-Chlone 907LTA) | 25 parts |

| Photosensitive composition (cyan) | |
|---|---|
| Diallyl isophthalate polymer (the foregoing Daiso Isodap) | 90 parts |
| Dipentaerythritol hexacrylate (made by Nippon Kayaku Co., Ltd.) | 30 parts |
| Cationic dye borate complex (compound IR-1) | 1 part |
| Organic boron ammonium salt (TBA.BTPB) | 3 parts |
| Hydroquinone | 0.005 part |
| Toluene | 190 parts |
| Methyl ethyl ketone | 200 parts |
| Cyanine Blue 4920 (made by Dainichiseika Co., Ltd.) | 60 parts |
| Chlorinated polyethylene (the foregoing Super-Chlone 907LTA) | 25 parts |

| Photosensitive composition (black) | |
|---|---|
| Diallyl isophthalte polymer (the foregoing Daiso Isodap) | 90 parts |
| Dipentaertthritol hexacrylate (made by Nippon Kayaku Co., Ltd.) | 30 parts |
| Cationic dye borate complex (compound IR-1) | 1 part |
| Organic boron ammonium salt (TBA.BTPB) | 3 parts |
| Hydroquinone | 0.005 part |
| Toluene | 190 parts |
| Methyl ethyl ketone | 200 parts |

A full color image was formed using image forming material P by subjecting black photosensitive composition layer 2d to a laser beam scanning exposure corresponding to a black image, and further subjecting, in sequence, cyan photosensitive composition layer 2c, magenta photosensitive composition layer 2b and yellow photosensitive composition layer 2a to laser beam scanning exposures corresponding to cyan, magenta and yellow images, respectively, under the same conditions as in Example 8.

After this imagewise exposure, photosensitive composition layer 2d (black) of image forming material P was superposed on a sheet of art paper being an image receiving body and passed through nip rolls heated at 150° C. to transfer the black image to the art paper, followed by image transfer in order of photosensitive composition layer 2c (cyan), photosensitive composition layer 2b (magenta) and photosensitive composition layer 2a (yellow). A full color image consisting of the uncured photosensitive compositions was obtained on the art paper.

The full color image so obtained was high in adhesion to the art paper and had a good appearance and quality close to those of the original print.

EXAMPLE 13

Images were formed by laser beam exposure in the same manner as in Example 3, except that the cationic dye borate complex and organic boron ammonium salt used in the photosensitive composition of Example 3 were replaced with the following ones. In forming images, the amount of energy necessary to form a good image (an average energy density of light irradiated on the photosensitive layer) and the sharpness of the corresponding image were as follows:

| Sample No. | Cationic Dye Borate Complex | Organic Boron Ammonium Salt | Average Energy Density (mJ/cm$^2$) | Image Sharpness |
|---|---|---|---|---|
| 1 | IR-2 | TBA.TABB | 3.0 | good |
| 2 | IR-5 | TBA.TABB | 4.0 | good |
| 3 | IR-7 | TBA.TABB | 2.0 | good |
| 4 | IR-8 | TBA.BTPB | 2.0 | good |
| 5 | IR-11 | TBA.BTPB | 3.0 | good |
| 6 | IR-12 | TBA.BTPB | 3.0 | good |
| 7 | IR-14 | TBA.HTPB | 2.0 | good |
| 8 | IR-16 | TBA.BTPB | 2.0 | good |

EXAMPLE 14

In Example 4, image forming material A prepared in Example 1 was processed. Unexposed portions were transferred to the covering film. The thus obtained covering film was laid face down on art paper. These were passed through transfer rollers, consisting of a pair of nip rollers at a temperature of 100° C. and at a pressure of 2 kg/m$^2$, cooled to room temperature and then the covering film was peeled off. A clear transferred image was obtained on the art paper. Image forming materials B to D were processed in the same way as above, and clear transferred images were similarly obtained. Comparative Examples 1 to 3

Image forming materials were prepared in the same manner as in Example 3, except that the cationic dye borate complex and organic boron ammonium salt used in the photosensitive composition were replaced with the following photopolymerization initiators. With these image forming materials, amounts of energy necessary to form images by scanning of semiconductor laser beams or argon laser beams (expressed by an average energy density of light irradiated on the photosensitive layer) were examined.

| | Composition | |
|---|---|---|
| Sample | Photopolymerization Initiator | Used Amount |
| Comp. Example 1 | none | |
| Comp. Example 2 | TBA.BTPB | 3 parts |
| Comp. Example 3 | diphenyl-iodonium.hexafluorophosphate | 3 parts |
| | Michler's ketone | 5 parts |

| | Results | |
|---|---|---|
| Sample | Semiconductor Laser (833 nm) | Argon Laser (488 nm) |
| Comp. Example 1 | not polymerized | not polymerized |
| Comp. Example 2 | not polymerized | not polymerized |
| Comp. Example 3 | not polymerized | 50 mJ/cm$^2$ |

What is claimed is:

1. A process of forming an image on an image forming material comprising a support and provided thereon, a photosensitive layer and a covering film in that order to form an image, comprising the steps of:

imagewise exposing the material by laser beam scanning using a semiconductor laser; and peeling the covering film from the exposed material to form an image on the support or on the covering film; wherein said photosensitive layer contains a colorant, an addition-polymerizable or cross-linkable compound and an effective amount to initiate photopolymerization of a photopolymerization initiator which is a salt of a cationic dye with a borate anion, said borate anion being represented by the following Formula (1):

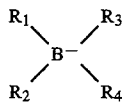

Formula (1)

wherein R$_1$, R$_2$, R$_3$ and R$_4$ independently represent an alkyl group, an aryl group, an aralkyl group, an alkenyl group, an alkinyl group, a cycloalkyl group, or a heterocyclic group; and said cationic dye being selected from the group consisting of cyanine dyes, indoaniline dyes and azulenium dyes.

2. The process of claim 1, wherein in said Formula (1) at least one of said R$_1$, R$_2$, R$_3$ and R$_4$ is an aryl group, and at least one of said R$_1$, R$_2$, R$_3$ and R$_4$ is an alkyl group.

3. The process of claim 1, wherein said photosensitive layer further comprises an ammonium salt of said borate anion.

4. The process of claim 1, wherein an adhesive layer is further provided between the photosensitive layer and the covering layer.

5. The process of claim 1, wherein an adhesive layer is further provided between the photosensitive layer and the support.

6. The process of claim 1, wherein said imagewise exposing was carried out by a near infra-red laser having an oscillation wavelength of 700 nm or more.

7. The process of claim 1, further comprising the steps of:

superposing the formed image on the support or on the covering film onto an image receiving material;

applying heat or pressure to the superposed materials to transfer the image to the image receiving material; and peeling the support or the covering film from the superposed materials to form a transferred image on the image receiving material.

8. The process of claim 7, wherein said imagewise exposing was carried out, corresponding to a yellow image to the material containing a yellow colorant to form a yellow image, corresponding to a magenta image to the material containing a magenta colorant to form a magenta image, and corresponding to a cyan image to the material containing a cyan colorant to form a cyan image, independently, the formed yellow image, magenta image, and cyan image being transferred to an image receiving material in that order to form a color image.

9. The process of claim 7, wherein said imagewise exposing was carried out, corresponding to a yellow image to the material containing a yellow colorant to form a yellow image, corresponding to a magenta image to the material containing a magenta colorant to form a magenta image, corresponding to a cyan image to the material containing a cyan colorant to form a cyan image, and corresponding to a black image to the material containing a black colorant to form a black image, independently, the formed yellow image, magenta image, cyan image and black image being transferred to an image receiving material in that order to form a color image.

10. A process of forming an image on an image forming material comprising a support and provided thereon, an adhesive layer a photosensitive layer and a covering layer in that order to form an image, comprising the steps of:

imagewise exposing the material by laser beam scanning using a semiconductor laser; and peeling the covering film from the exposed material to form images of exposed portions on the support, wherein said photosensitive layer contains a colorant, an addition-polymerizable or cross-linkable compound and an effective amount to initiate photopolymerization of a photopolymerization initiator which is a salt of a cationic dye with a borate anion, said borate anion being represented by the following Formula (1):

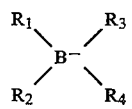

Formula (1)

wherein R$_1$, R$_2$, R$_3$ and R$_4$ independently represent an alkyl group, an aryl group, an aralkyl group, an alkenyl group, an alkinyl group, a cycloalkyl group, or a heterocyclic group; and said cationic dye being selected from the group consisting of cyanine dyes, indoaniline dyes and azulenium dyes.

11. The process of claim 1, wherein said cationic dye is a cyanine dye.

12. The process of claim 1, wherein said cationic dye is an azulenium dye.

13. The process of claim 1, wherein said cationic dye is a an indoaniline dye.

* * * * *